ent Number: 4,683,190
Date of Patent: Jul. 28, 1987

[54] PROCESS TO LOWER THE VISCOSITY OF COATING SOLUTIONS FOR THE PRODUCTION OF LIGHT-SENSITIVE REPRODUCTION MATERIALS

[75] Inventors: Manfred A. J. Sondergeld, Muhlheim/Main; Dietmar Dudek, Oberursel; Klaus Hossner, Rodgau, all of Fed. Rep. of Germany

[73] Assignee: E. I. Du Pont de Nemours and Company, Wilmington, Del.

[21] Appl. No.: 810,364

[22] Filed: Dec. 18, 1985

[30] Foreign Application Priority Data

Nov. 24, 1984 [DE] Fed. Rep. of Germany ....... 3514768

[51] Int. Cl.$^4$ ................................. G03C 1/76
[52] U.S. Cl. .................................. 430/281; 430/919; 522/77; 524/98; 524/100; 524/106; 524/247; 524/251; 524/257; 524/258
[58] Field of Search ................. 430/281, 919; 522/77; 524/98, 100, 106, 247, 251, 257, 258

[56] References Cited

U.S. PATENT DOCUMENTS

| | | |
|---|---|---|
| 2,927,022 | 3/1960 | Martin et al. ........................... 96/35 |
| 4,421,840 | 12/1983 | Lehner et al. ........................ 430/281 |
| 4,499,176 | 2/1985 | Curtis et al. ......................... 430/253 |

FOREIGN PATENT DOCUMENTS

3327523A1 7/1985 Fed. Rep. of Germany .
900244 1/1982 U.S.S.R. .

Primary Examiner—Jack P. Brammer

[57] ABSTRACT

Process for lowering the viscosity of coating solutions containing a thixotropy-causing filler for the production of light-sensitive reproduction materials by adding at least one compound corresponding to one of the following formulas:

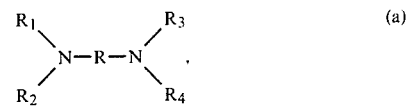

(a)

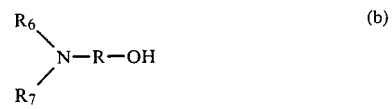

(b)

or

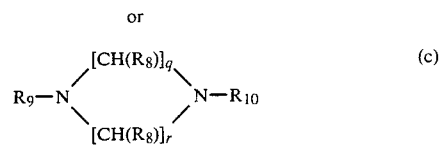

(c)

wherein
R is a linear saturated or unsaturated hydrocarbon chain having 2 to 12 carbon atoms, optionally substituted in which one or more carbon atoms can be replaced by $N(R_5)$, O, S, and/or an aromatic radial, or a 5 to 8 membered aliphatic ring.
$R_1$ to $R_4$ are H, alkyl, aryl, and aralkyl, whereby $R_1$ to $R_4$ can be the same or different;
$R_5$ is $R_1$ to $R_4$;
$R_6$ and $R_7$ are $R_1$ to $R_4$, $—(CHR_8)_p—OH$;
p is 1 to 6;
q and r are 1 to 6 and can be the same or different;
$R_8$ is H, alkyl;
$R_9$ and $R_{10}$ are H, alkyl, $—(CHR_8)_p—OH$.

12 Claims, No Drawings

PROCESS TO LOWER THE VISCOSITY OF COATING SOLUTIONS FOR THE PRODUCTION OF LIGHT-SENSITIVE REPRODUCTION MATERIALS

DESCRIPTION

1. Technical Field

The invention relates to a process to lower the viscosity of coating solutions that contain a thixotropy-producing filler, as well as reproduction materials produced from these coating solutions.

2. Background Art

Light-sensitive reproduction materials in which differences in the properties of the exposed and unexposed areas of the light-sensitive layer, e.g., differences in solubility, differences in softening or tackiness point, differing adhesion, differing permeability for processing solutions, etc., are used to produce the image, are employed for many applications in the photographic reproduction sector. To produce these materials, the constituents of the light-sensitive layer which include light-sensitive compound or the light-sensitive system respectively, a polymeric binder, and other additives, for example dyes, pigments, plasticizers, fillers, stabilizers, etc., are dissolved in an organic solvent and are applied onto a suitable film base.

Light-sensitive materials produced from these coating solutions must fulfill a series of requirements that can frequently only be combined with difficulty. Thus, these layers must have adequate elasticity and plasticity in both the unexposed and the exposed state. Organic binders with salt-forming groups used in aqueous-alkaline developable materials frequently cause undesirable brittleness in the exposed layer. In order to endow the layers with the necessary elasticity and plasticity, it is usual to add plasticizer to the layers or to use selected organic binders of a certain composition, or else, for instance in the case of light-curable reproduction materials, to select the binder/light-curable compound ratio such that the degree of cross-linking achieved during the exposure is not too high.

All these measures cause a reduction in mechanical strength, particularly when these materials are rolled up or stacked or exposed in another manner to increased pressure and/or increased temperatures, so that the light-sensitive layer begins to flow at the margins and sticks together the edges of the stacked or rolled-up material. To prevent this cold flow, it is known from MacLachlan U.S. Pat. No. 3,867,153 to cure the margins of the light-sensitive material by a diffuse exposure. Another known measure to control the rheological behavior of light-sensitive reproduction materials is the addition of organic or inorganic fillers such as e.g., talc, calcium carbonate, barium sulfate, glass powder, bentonite, silicas, silicic acids, especially finely-divided pyrogenic silicic acids. Such fillers are known from U.S. Pat. No. 2,927,022, U.S.S.R. Pat. No. 900 244, German Preliminary Published Application 3 236 143, and German Preliminary Published Application 3 327 523. Finely divided silicic acids with a large surface area have proven to be particularly good as fillers, since they do not impair the other properties of light-sensitive materials.

It is a disadvantage, however, that these silicic acids, because they cause thixotropy, increase the visicosity of the coating solutions so much that they can not be coated under the usual coating conditions. The amount of filler that can be added to the coating solutions is thus limited, i.e., it is frequently not possible to use these fillers in a concentration necessary for the effect to be achieved. Lowering the solids content of the solution by dilution does indeed reduce the viscosity, but places increased requirements on the drying capacity of the coating machine and on the solvent recovery, which considerably limits cost-effective production of the light-sensitive materials.

It is an object of the present invention to lower the viscosity of coating solutions that contain a thixotropy-causing filler so that these solutions can be coated under the usual coating conditions, in spite of a high solids content.

DISCLOSURE OF THE INVENTION

In accordance with this invention there is provided a process to lower the viscosity of coating solutions for the production of light-sensitive reproduction materials comprising the constituents:

at least one polymeric binder containing salt-forming groups, at least one light-sensitive compound that, when exposed to actinic radiation in the form of a layer, changes the solubility, tackiness, or adhesion of the light-sensitive layer, optionally a photoinitiator or a photoinitiator system, and at least one thixotropy-causing filler, said constituents being dissolved in at least one organic solvent, the improvement wherein silicic acid having silanol groups present at least partially in free form and an $SiO_2$ content greater than 70% by weight is present as the thixotropy-causing filler, and at least one amine-containing compound of the following formulas is added to the coating solution to lower its viscosity:

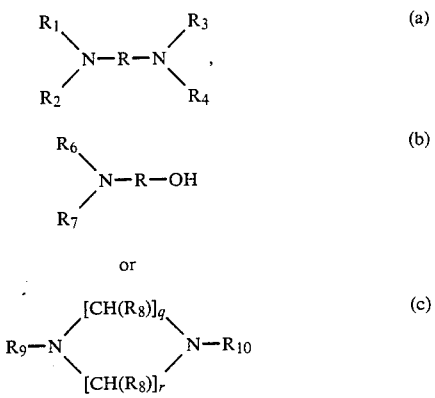

wherein

R is a linear saturated or unsaturated hydrocarbon chain having 2 to 12 carbon atoms, optionally substituted in which one or more carbon atoms can be replaced by $N(R_5)$, O, S, and/or an aromatic radical, or a 5 to 8 membered aliphatic ring.

$R_1$ to $R_4$ are H, alkyl, aryl, and aralkyl, whereby $R_1$ to $R_4$ can be the same or different;

$R_5$ is $R_1$ to $R_4$;

$R_6$ and $R_7$ are $R_1$ to $R_4$, $-(CHR_8)_p-OH$;

p is 1 to 6;

q and r are 1 to 6 and can be the same or different;

$R_8$ is H, alkyl;

$R_9$ and $R_{10}$ are H, alkyl, $-(CHR_8)_p-OH$.

Surprisingly, it has turned out that the viscosity of coating solutions that contain a thixotropy-producing filler can be lowered by a factor of 3–120 by the addition of at least one amine-containing compound of above classes (a), (b), or (c). The amine-containing compounds can be added to the coating solution in amounts of 0.01 to 5% preferably 0.1 to 1.5% by weight relative to the solids content of the dried layer.

The process of this invention makes it possible to produce coating solutions having a content of up to 15% by weight of thixotropy-causing filler relative to the solids content of the dried material, whose viscosity is in the range of coating solutions with a similar solids content that do not contain this type of filler, and that can be coated without difficulty with conventional coating devices.

This result is surprising for those skilled in the art insofar as it is known from the Degussa series Pigments, No. 23, that multifunctional compounds that can form hydrogen bridges, e.g., ethylene diamine, cause an increase in viscosity in nonpolar media in the presence of thixotropy-producing fillers.

To produce the coating solutions, all soluble constituents such as binders, light-sensitive compounds such as monomers, photoinitiator systems, and other additives, are dissolved in at least one organic solvent. It is expedient to add one or more amine-containing compounds of substance classes (a), (b), (c) to the solution before adding the thixotropy-producing filler. It is also possible, however, to add the filler first and then the amine-containing compounds of substance classes (a), (b), or (c). Both methods lead to coating solutions of equal viscosity. After all constituents have been added, the coating solution is treated, e.g., with a high-speed agitator, dissolver, a ball- or sand mill, to obtain a finely-divided dispersion of the filler.

Typical amine-containing compounds that lower the viscosity include: 1,2-diaminoethane, 1-3-diaminopropane, 1,4-diaminobutane. 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,4-diaminobutene(2), 1,5-diaminopentene(2), 1,6-diaminohexene(2), 1,6-diaminohexene(3), 1,6-diaminohexadiene(2,4), 1,7-diaminoheptene(2), 1,7-diaminoheptene(3), 1,7-diaminoheptadiene(2,4), 1,7-diaminoheptadiene(2,5), 1,8-diaminooctene(2), 1,8-diaminooctene(4), triethylene tetramine, 2,2'-diaminodiethyl ether, 2,2'-diaminodiethyl thioether, 6,6'-diaminodihexyl ether, o-, m-, p-xylilene diamine, 1,2-diaminocyclohexane, 1,4-diaminocyclohexane, 1,2-bis-(2-aminoethyl)-cyclohexane, 1,6-diamino-2-ethyl hexane, 1,2-diaminopropane, 1,3-diaminohexane, N-ethyl-1,2-diaminoethane, N,N'-diethyl-1,2-diaminoethane, N,N-diethyl-1,2-diaminoethane, N,N,N'-triethyl-1,2-diaminoethane, N,N,N',N'-tetraethyl-1,2-diaminoethane, N-phenyl-1,2-diaminoethane, N,N'-diphenyl-1,2-diaminoethane, tris-(2-aminoethyl)-amine, tris-(2-hydroxyethyl)-amine, mono-(2-hydroxyethyl)-amine, bis-(2-hydroxy-ethyl)-amine, (2-hydroxyethyl)-dimethylamine, (2-hydroxyethyl)-methylamine, bis-(2-hydroxyethyl)-methylmine, 1-amino-3-hydroxypropane, N-ethyl-N,N'-dimethyl-1,2-diaminoethane, 1,3-diazacycloheptane, piperazine, 1,4-diazacyclooctane and, N-methyl-1,3-diazacycloheptane. Aliphatic amines with at least two optionally substituted amino groups and a saturated hydrocarbon chain with 2 to 6 carbon atoms such as e.g.: 1,2-diaminoethane, 1,6-diaminohexane, N-ethyl-1,2-diaminoethane, N,N'-diethyl-1,2-diaminoethane, N,N-diethyl-1,2-diaminoethane, and N,N,N',N'-tetraethyl-1,2-diaminoethane, have particular significance thereby. Mono-, bis-, and tris-(2-hydroxyethyl)-amines have also proven to be particularly good.

Finely divided silicic acids that greatly increase the mechanical strength in the dry mass of the coating solution at as low a percentage as possible, are suitable as fillers. Silicic acids having at least partially free silanol groups, an $SiO_2$ content >70% by weight, a surface according to BET of between 50 and 400 $m^2/g$, and a primary particle size between 7 and 50 nm, have proven to be particularly suitable. Part of the silanol groups at the surface area of the silicic acid can be modified by organic radicals. According to the invention, however, it is essential that part of these silanol groups be present in a free form.

Polymeric binders with groups suitable for salt formation are known. These binders contain preferably acid groups that form salts in an alkaline medium. Carboxyl-, sulfonic acid-, sulfonamide-, or hydroxy groups are suitable. The following are illustrations: polymers composed of acrylic acid or methacrylic acid, or their copolymers with other monomers, e.g., acrylic acid ester or other acryl derivatives, vinyl compounds such as vinyl ether, vinyl acetate, or its saponification products, styrene, vinyl pyrrolidone, butadiene and related monomers, polyacrylic acid anhydrides, copolymers of maleic acid anhydride, maleic acid, maleic acid semiesters, maleic acid semiamides or anhydrides and derivatives of related compounds respectively, e.g., itaconic acid, with suitable comonomers, e.g., styrene, vinyl ethers, vinyl acetates, etc. The amount of binder is, in general, 20–90% by weight based on the total constituents of the coating less any solvents present.

The number average molecular weight of the binder is, in general, 5000 to 100,000, and the acid number is preferably between 60 and 200.

There are no restrictions with respect to the light-sensitive compounds. All known light-sensitive compounds or light-sensitive systems, respectively, that change the solubility, tackiness, or adhesion of the light-sensitive layer by exposure to light, can be added to the coating solutions. Systems whose solubility in the processing solution changes when exposed to light, are particularly important. To this category belong both light-curing systems and those that become more soluble at the exposed points. The preferred light-curable systems contain as the light-sensitive component either one or more addition-polymerizable monomers, or polymer compounds that contain light-sensitive groups by which cross-linking of the polymer chain takes place during the exposure. Particularly suitable are polymers that contain cinnamic acid ester groups, arylazide-, or aryl sulfonazide groups in the side chain. Such compounds are described in Chapter 4 of the book "Light-Sensitive Systems" by Jaromir Kosar, New York, 1965. Light-sensitive layers in which the solubility is increased by light preferably contain diazo compounds such as quinone diazides or diazonium salts. Another system is known from German Preliminary Published Application 2,242,106 and German Pat. No. 2,718,130.

Of the light-sensitive systems mentioned, photopolymerization is particularly significant in connection with the present invention, whereby processes that lead to a relief structure are preferred. Other processing variants such as toning or peel-apart developing are also of interest, however.

Suitable addition-polymerizable monomers for the production of photopolymerizable layer are known from the literature in large numbers, e.g., from German Pat. No. 1,210,321. By way of example the following monomers should be mentioned: ethylene glycol diacrylate, diethylene glycol diacrylate, glycerin diacrylate, glycerin triacrylate, ethylene glycol dimethacrylate, 1,3-propanediol dimethacrylate, 1,2,4-butanetriol trimethacrylate, 1,4-cyclohexanediol diacrylate, 1,4-hydroquinone dimethacrylate, pentaerythrite tetramethacrylate, trimethylolpropane triacrylate, 1,3-propanediol diacrylate, 1,5-pentanediol dimethacrylate, or the bis-acrylates and bis-methacrylates of polyethylene glycols with a molecular weight of 200–500.

Practically all compounds known for this purpose can be used as photopolymerization initiators. The photoinitiator system initiating the addition polymerization can contain one or more compounds that yield free radicals either directly when they are activated by irradiation, or after they have been excited to do so by means of a sensitizer activated by the irradiation. Examples of suitable photoinitiators or photoinitiator systems are: benzophenone/Michler's ketone, hexaaryl bisimidazoles/mercaptobenzoxazole, substituted thioxanthones/tertiary amines, and benzyl dimethyl ketal. The concentration of the photoinitiator system forming free radicals is preferably about 0.01 to 10% by weight present based on the total constituents of the coating (less solvent).

In addition to the constituents already named, the coating solution can contain further additives, e.g., sensitizers, stabilizers, dyes, pigments, plasticizers, and coating aids, etc.

To produce the reproduction materials, the coating solutions are applied onto suitable supports by known methods and are subsequently dried. Suitable supports include, e.g., paper, metallic supports, glass, and ceramic supports, as well as film bases composed of plastic films such as polyethylene, polypropylene, polycarbonate, polyamide, polyesters, etc.

The reproduction materials obtained from the coating solutions of the invention are suitable for a large number of applications in the reproduction sector, e.g., for the production of printing plates or colorproofing films. A preferred application, however, is as a photoresist.

To produce the image, the light-sensitive material is preferably exposed through an original with radiation sources that emit an irradiation rich in ultraviolet light, e.g.; mercury vapor lamps, xenon lamps, etc. If the light-sensitive material contains a sensitizer for visible light, light sources emitting longer wavelengths can also be used. Depending on the type of light-sensitive system used, the exposed material can then either be converted into a relief image by washing off with a suitable solvent, or the image is made visible by treating the light-sensitive layer with a toner, or by peeling apart.

EXAMPLES

The following examples are intended to illustrate but not limit the invention. The percentages and parts are by weight unless further defined. All viscosity measurements were performed according to DIN 51398, 51550, and 53018, using a commercial Brookfield rotation viscosimeter, type LVF. The number average molecular weights (Mn) can be determined by gel permeation chromatography employing a polystyrene standard known to those skilled in the art. BET is a measuring method to determine the surface area of solids. The method is based on the fact that the surface area of solids adsorbs a defined quantity of gas molecules or molecules of substances dissolved in a solvent, whereby the adsorbed quantity is—under definite conditions—proportional to the size of the surface area. BET measuring is performed according to DIN 66131 and 66132.

EXAMPLE 1

A coating solution of the following composition was produced:

| | |
|---|---|
| Methylene chloride | 309 g |
| Methanol | 16 g |
| Copolymer comprising methyl methacrylate, ethyl acrylate, acrylic acid (55/38/7 parts by weight), Mn is 30,000 | 86 g |
| Trimethylol propane triacrylate | 58 g |
| Benzyl dimethyl ketal | 13 g |
| Silicic acid; $SiO_2$ content >99.8% surface area according to BET 200 $m^2/g$, primary particle size 12 nm | 18 g |

The solution was agitated for 4 min with a high-speed agitator to disperse the silicic acid. The solids content of the solution was 35% by weight. The viscosity, measured with a Brookfield viscosimeter, spindle 4 at 6 rpm, was 45,000 mPa's.

The coating solution was then divided into 5 samples (a) to (e) and 0.2 g of the compounds shown in Table 1 were added to each sample. The viscosity was then measured using a Brookfield viscosimeter, spindle 3, at 60 rpm. The results are summarized in Table 1.

TABLE 1

| Sample | | Viscosity in mPa's |
|---|---|---|
| (a) | 1,6-diaminohexane | 400 |
| (b) | Triethylene tetramine | 700 |
| (c) | p-xylilenediamine | 2000 |
| (d) | N—phenyl-1,2-diaminoethane | 900 |
| (e) | N,N,N',N'—tetraethyl-1,2-diaminoethane | 600 |

EXAMPLE 2

A coating solution of the following composition was produced as described in Example 1:

| | |
|---|---|
| Methylene chloride | 62.0 g |
| Methanol | 3.0 g |
| Copolymer of Ex 1 | 17.0 g |
| Triethylene glycol dimethacrylate | 11.6 g |
| Benzyl dimethyl ketal | 2.8 g |
| Silicic acid of Ex. 1 | 3.5 g |

The solids content of the solution was 35% by weight and the viscosity was 43,000 mPa's. By adding 0.3 g of 1,2-diaminocyclohexane, the viscosity was lowered to 1800 mPa's.

EXAMPLE 3

A coating solution of the following composition was produced as described in Example 1:

| Methylene chloride | 123.5 g |
|---|---|
| Methanol | 6.5 g |
| Copolymer of Ex 1 | 34.3 g |
| Trimethylol propane triacrylate | 13.1 g |
| Triethylene glycol dimethacrylate | 10.0 g |
| Benzyl dimethyl ketal | 5.6 g |
| Silicic acid of Ex. 1 | 7.0 g |

The solids content of the solution was 35% by weight and the viscosity was 44,000 mPa's.

0.2 g respectively of the compounds shown in Table 2 were added to 100 g respectively of this coating solution, and the viscosity was determined.

The results are summarized in Table 2:

TABLE 2

| Sample | | Viscosity in mPa's |
|---|---|---|
| (a) | 1-amino-3-hydroxypropane | 900 |
| (b) | Tris-(2-hydroxyethyl)-amine | 1300 |

EXAMPLE 4

A coating solution of the following composition was produced as described in Example 1:

| Methylene chloride | 123.5 g |
|---|---|
| Methanol | 6.5 g |
| Copolymer of Ex 1 | 34.3 g |
| Trimethylol propane triacrylate | 13.1 g |
| Trimethylol propane trimethacrylate | 10.0 g |
| Benzyl dimethyl ketal | 5.6 g |
| Silicic acid of Ex. 1 | 7.0 g |

The solids content of the solution was 35% by weight and the viscosity was 45,000 mPa's.

0.2 g respectively of the compounds shown in Table 3 were added to 100 g respectively of this coating solution, and the viscosity was determined.

TABLE 3

| Sample | | Viscosity in mPa's |
|---|---|---|
| (a) | Piperazine | 1000 |
| (b) | Diazacycloheptane | 3200 |

EXAMPLE 5

A coating solution of the following composition was produced as described in Example 1:

| Methylene chloride | 62 g |
|---|---|
| Methanol | 3 g |
| Copolymer composed of methyl methacrylate and methacrylic acid (90/10 parts), $\overline{M}n$ is 30,000 | 17 g |
| Trimethylol propane triacrylate | 11.6 g |
| Benzyl dimethyl ketal | 2.8 g |
| Silicic acid of Ex. 1 | 3.5 g |

The solids content of the solution was 35% by weight and the viscosity was 50,000 mPa's. By adding 0.2 g of 1,6-diaminohexane, the viscosity was lowered to 950 mPa's.

EXAMPLE 6

A coating solution of the following composition was produced as described in Example 1:

| Methylene chloride | 62 g |
|---|---|
| Methanol | 3 g |
| Copolymer of Ex. 1 | 17 g |
| Trimethylol propane triacrylate | 11.6 g |
| Benzyl dimethyl ketal | 2.8 g |
| Silicic acid; $SiO_2$ content 82–86% surface area according to BET 170 $m^2/g$ | 3.5 g |

The solids content of the solution was 35% by weight and the viscosity was 35,000 mPa's. By adding 0.2 g of 1,2-diaminoethane, the viscosity was lowered to 500 mPa's.

EXAMPLE 7

In order to be able to coat a coating solution having the following solids composition:

| Copolymer of Ex. 1 | 49% |
|---|---|
| Trimethylol propane triacrylate | 33% |
| Benzyl dimethyl ketal | 8% |
| Silicic acid of Ex. 1 | 10% | with usuable viscosities in a methylene chloride (95%)/methanol (5%) solvent mixture, the solution must be diluted to a solids content of about 22% by weight. At this dilution, the viscosity is 900 mPa's. When such a diluted solution is coated, however, the amount of solvent to be removed is so great that the capability of both the conveying and drying equipment and also the equipment for solvent recovery, is exceeded.

If a change is made to concentrated solutions having a solids content of 35% by weight, the viscosity rises to over 45,000 mPa's, i.e., the solution cannot be coated. The viscosity can be lowered to 400 mPa's by adding 0.5% of 1,6-diaminohexane relative to the solids content of the coating solution. The values given are again summarized in Table 4.

TABLE 4

| Solids content of coating solution (%) | 1,6-diamino-hexane (%) | Viscosity in mPa's |
|---|---|---|
| 22 | — | 800 |
| 35 | — | 45,000 |
| 35 | 0.5 | 400 |

We claim:

1. A process to lower the viscosity of coating solutions for the production of light-sensitive reproduction materials comprising
    (A) dissolving in a mixture of solvents a mixture comprising the constituents:
        (1) at least one polymeric binder containing salt-forming groups in an amount of 20 to 90% by weight based on the total constituents of the coating less any solvents present, and
        (2) at least one light-sensitive compound that, when exposed to actinic radiation in the form of a layer, changes the solubility, tackiness, or adhesion of the light-sensitive layer taken from the group consisting of light-curing systems of the addition polymerizable and photocrosslinkable types and photosoluble systems, and (B) adding to the solvent mixture (3) at least one thixotropy-causing filler which is a silicic acid having silanol groups present at least partially in free form and an $SiO_2$ content greater than 70% by weight in an amount of up to 15% by weight of thixotropy-causing filler relative to the solids content of a dried layer, and (4) at least one amine-containing compound to lower the viscosity of the coating solution, said amine-containing compound being of the following formulas

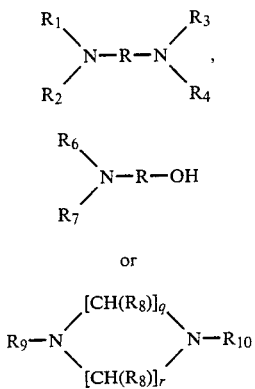

wherein

R is a linear saturated or unsaturated hydrocarbon chain having 2 to 12 carbon atoms in which one or more carbon atoms can be replaced by $N(R_5)$ O, S, and/or an aromatic radical, or a 5 to 8 membered aliphatic ring;

$R_1$ to $R_4$ are H, alkyl, aryl, and aralkyl, whereby $R_1$ to $R_4$ can be the same or different;

$R_5$ is $R_1$ to $R_4$;

$R_6$ and $R_7$ are $R_1$ to $R_4$, $-(CHR_8)_p-OH$;

p is 1 to 6;

q and r are 1 to 6 and can be the same or different;

$R_8$ is H, alkyl;

$R_9$ and $R_{10}$ are H, alkyl, $-(CHR_8)_p-OH$, the at least one amine-containing compound being present in an amount of 0.01 to 5% by weight relative to the solids content of a dried layer and being added to the coating solution before or after adding the thixotropy-causing filler.

2. A process according to claim 1 wherein the mixture of solvents is a mixture of methylene chloride and methanol.

3. A process according to claim 1 wherein the amine-containing compound is an aliphatic amine having at least 2 amino groups and a saturated hydrocarbon chain with 2 to 6 carbon atoms.

4. A process according to claim 1 wherein the amine-containing compound is 1,2-diaminoethane, N-ethyl-1,2-diaminoethane, N,N'-diethyl-1,2-diaminoethane, 1,6-diaminohexane or a mixture thereof.

5. A process according to claim 1, wherein the amine-containing is a mono-, bis-, tris-(2-hydroxyethyl)-amine or a mixture thereof.

6. A process according to claim 1 wherein pyrogenic silicic acid having silanol groups present at least partially in free from, an $SiO_2$ content greater than 70% by weight, a surface according to BET of between 50 and 400 m²/g, and an average primary particle size of 7–50 nm, is present as the thixotrophy-causing filler.

7. A process according to claim 1 wherein a photoinitiator or a photoinitiator system is present as one of the constituents of the solvent mixture.

8. A process according to claim 7 wherein the light-sensitive compound is at least one photopolymerizable ethylenically unsaturated compound.

9. A process according to claim 1 wherein R is a substituted linear saturated or unsaturated hydrocarbon chain having 2 to 12 carbon atoms in which one or more carbon atoms can be replaced by $N(R_5)$, O, S, and/or an aromatic radial, or a 5 to 8 membered aliphatic ring.

10. A process according to claim 3 wherein the amino groups are substituted.

11. A process according to claim 1 wherein the amine-containing compound is added to the coating solution before the thixotrophy-causing filler.

12. A process according to claim 1 wherein the amine-containing compound is added to the coating solution after the thixotrophy-causing filler.

* * * * *